(12) United States Patent
Bormann et al.

(10) Patent No.: US 7,589,411 B2
(45) Date of Patent: Sep. 15, 2009

(54) DEVICE FOR ELECTRICAL CONNECTION OF AN INTEGRATED CIRCUIT CHIP

(75) Inventors: Pierre Bormann, Tullins (FR); Luc Morineau, Gieres (FR); Jacques Chavade, Moirans (FR)

(73) Assignee: STMicroelectronics SA, Montrouge (FR)

( * ) Notice: Subject to any disclaimer, the term of this patent is extended or adjusted under 35 U.S.C. 154(b) by 444 days.

(21) Appl. No.: 11/305,886

(22) Filed: Dec. 16, 2005

(65) Prior Publication Data

US 2006/0138636 A1 Jun. 29, 2006

(30) Foreign Application Priority Data

Dec. 17, 2004 (FR) .................................. 04 13482

(51) Int. Cl.
*H01L 23/48* (2006.01)
*H01L 23/52* (2006.01)

(52) U.S. Cl. ........................ 257/692; 257/698; 257/774; 257/773; 257/786; 257/E23.011

(58) Field of Classification Search ................ 257/692, 257/698, 778, 773, 786, 774, E23.011
See application file for complete search history.

(56) References Cited

U.S. PATENT DOCUMENTS

| | | | |
|---|---|---|---|
| 5,847,936 A | | 12/1998 | Forehand et al. |
| 5,952,726 A | * | 9/1999 | Liang ........................ 257/778 |
| 6,229,099 B1 | * | 5/2001 | Horiuchi et al. ............. 174/261 |
| 6,335,493 B1 | * | 1/2002 | Horiuchi et al. ............. 174/261 |
| 6,373,131 B1 | * | 4/2002 | Karnezos ..................... 257/712 |
| 6,448,639 B1 | | 9/2002 | Ma |
| 6,847,120 B2 | * | 1/2005 | Ohno .......................... 257/778 |
| 7,061,785 B2 | * | 6/2006 | Miwa et al. ................... 365/63 |
| 2005/0098886 A1 | * | 5/2005 | Pendse ........................ 257/738 |

OTHER PUBLICATIONS

"Enhanced Access Chip Footprint," IBM Technical Disclosure Bulletin, V38/2, pp. 203-204 dated Feb. 1, 1995, XP00050244, ISSN 0018-8689.

Preliminary Search Report for French Application No. 04 13482 dated Aug. 5, 2005.

* cited by examiner

*Primary Examiner*—Nitin Parekh
(74) *Attorney, Agent, or Firm*—Lisa K. Jorgenson; Stephen Bongini; Fleit Gibbons Gutman Bongini & Bianco P.L.

(57) ABSTRACT

A device is provided for electrically connecting an integrated circuit chip. The device includes a main board, an intermediate board, and electrical connection balls in a space separating the boards. In the space, a peripheral zone comprises a peripheral matrix of balls, a central zone comprises a central matrix of balls, a first secondary zone comprises a matrix of electrical connection vias linked to the balls of the two adjacent rows of balls of the peripheral matrix, and a second secondary zone comprises a matrix of electrical connection vias linked to balls of the central matrix. The first secondary zone and the second secondary zone are separated by an intermediate zone that includes at least a first part having at least one complementary row of electrical connection balls, and a second part having complementary electrical connection vias linked to the balls of this complementary row.

14 Claims, 1 Drawing Sheet

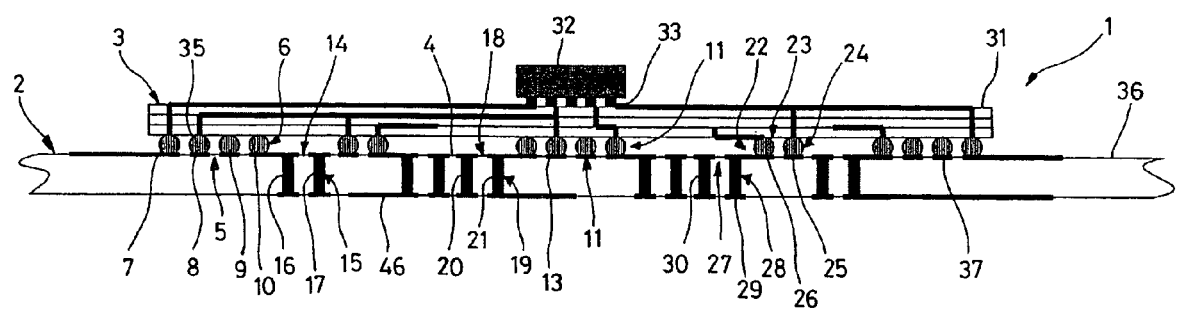
FIG_1
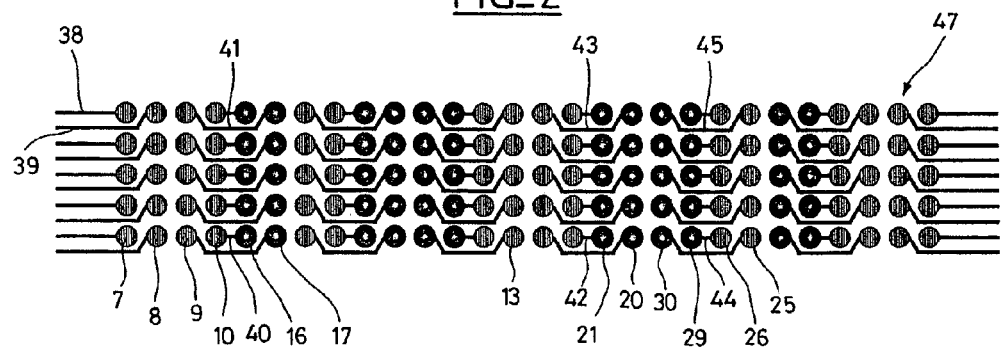
FIG_2

DEVICE FOR ELECTRICAL CONNECTION OF AN INTEGRATED CIRCUIT CHIP

CROSS-REFERENCE TO RELATED APPLICATIONS

This application is based upon and claims priority from prior French Patent Application No. 04 13482, filed Dec. 17, 2004, the entire disclosure of which is herein incorporated by reference.

FIELD OF THE INVENTION

The present invention relates to devices for the electrical connection of an integrated circuit chip.

BACKGROUND OF THE INVENTION

To install and connect an integrated circuit chip on a main board which has electrical connection pads on a first face and which has electrical connection tracks linked to these pads and to electronic components mounted on this main board, it is known to provide an intermediate electrical connection board parallel to the main board.

This intermediate board has first electrical connection pads made on a first face for the connection of the chip, second electrical connection pads made on a second face, and electrical links between the first and second pads.

Electrical connection balls are placed in a space separating the intermediate board and the main board and are interposed between the second pads of the intermediate board and the pads of the main board.

According to a common embodiment, there is provided, in the space, a peripheral zone which comprises a peripheral matrix of five rows of balls, a central zone which comprises a central matrix of balls, and a middle zone devoid of balls which separates the peripheral zone and the central zone.

The main board also has tracks radiating outward which are linked to the balls of the outer row of the peripheral matrix and radiating tracks which pass between the balls of the outer row and are linked to the balls of the second outer row that is adjacent to this outer row.

The main board also has, in the middle zone, a matrix of two outer rows of electrical connection vias adjacent to the peripheral matrix, and has, on its aforesaid first face, short tracks radiating inward which link the balls of the two inner rows of the peripheral matrix and the vias, passing alternately between the balls of the inner row of balls and the outer row of vias.

The main board also has, in the middle zone, a matrix of two inner rows of electrical connection vias adjacent to the peripheral matrix, and has, on its aforesaid first face, short tracks radiating outward which link the balls of the two outer rows of the central matrix and the vias, passing alternately between the balls of the outer row of balls of this matrix and the inner row of vias.

The main board furthermore has, in the peripheral zone, electrical connection vias and short electrical connection tracks which link these vias to the balls of the middle row of the peripheral matrix.

This layout of vias in the peripheral zone in which the connection pads of the peripheral matrix are provided raises difficulties when seeking to reduce the pitch separating them.

SUMMARY OF THE INVENTION

It is an object of the present invention to remedy this drawback, while not reducing the number of possible connections between the main board and the intermediate board, possibly increasing this number.

One embodiment of the present invention provides an electrical connection device for connecting an integrated circuit chip to other components. The device includes a main board, and intermediate board, and electrical connection balls. The main board has electrical connection pads and electrical connection tracks on a first face, and electrical connection vias. The intermediate board has first electrical connection pads on a first face for the connection of the chip, second electrical connection pads on a second face, and electrical connection means electrically connecting the first and second pads. The electrical connection balls are in a space separating the main board and the intermediate board, and are interposed between the pads of the main board and the second pads of the intermediate board.

In the space, a peripheral zone comprises a peripheral matrix of four rows of balls, a central zone comprises a central matrix of balls, a first secondary zone comprises a matrix of two rows of electrical connection vias in the main board that are linked by tracks to the balls of the two adjacent rows of balls of the peripheral matrix, and a second secondary zone comprises a matrix of electrical connection vias in the main board that are linked by tracks to balls of the central matrix.

The first secondary zone and the second secondary zone are separated by an intermediate zone. The intermediate zone is divided into at least a first part that comprises at least one complementary row of electrical connection balls, and a second part that comprises complementary electrical connection vias in the main board that are linked by tracks to the balls of this complementary row.

In some embodiments of the present invention, the intermediate zone includes at least two complementary rows of electrical connection balls, and at least two complementary rows of complementary electrical connection vias in the main board.

Preferably, the pads and the vias are, relative to one another, disposed according to a constant pitch.

Another embodiment of the present invention provides an information processing system that includes such an electrical connection device.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 1 represents a cross section through an electrical connection device according to a preferred embodiment of the present invention, and FIG. 2 represents a partial top view of the main board of FIG. 1.

DETAILED DESCRIPTION OF PREFERRED EMBODIMENTS

Preferred embodiments of the present invention will be described in detail hereinbelow with reference to the attached drawings.

FIG. 1 shows an electrical connection device according to a preferred embodiment of the present invention. As shown, the electrical connection device 1 includes a main printed circuit board 2 with one or more layers, and an intermediate board 3 that is parallel to the main board 2 and separated from it by a space 4. This intermediate board 3 has, for example, a square perimeter.

This space 4 has a peripheral zone 5 in which there is formed a peripheral matrix 6 of four rows of electrical connection balls (labeled from the outside toward the inside with the references 7, 8, 9 and 10), and a central zone 11 in which there is formed a square central matrix 12 of electrical connection balls 13.

The space 4 also has a first secondary zone 14, adjacent to the peripheral zone 5 and inside it, in which there is formed a matrix 15 of two rows of electrical connection vias made in the main board 2 (labeled from the outside toward the inside with the references 16 and 17).

The space 4 also has a second secondary zone 18, adjacent to the central zone 11 and outside it, in which there is formed a matrix 19 of two rows of electrical connection vias made in the main board 2 (labeled from the outside toward the inside by the references 20 and 21).

Between the first secondary zone 14 and the second secondary zone 18 there is provided an intermediate zone 22 which separates the two secondary zones.

In this exemplary embodiment, this intermediate zone 22 has a part 23, adjacent to the first secondary zone 14 and inside it, in which there is formed an intermediate matrix 24 of two rows of electrical connection balls (labeled from the outside to the inside by the references 25 and 26).

The intermediate zone 22 also has a part 27, adjacent to the second secondary zone 18 and to part 23, in which there is formed an intermediate matrix 28 of two rows of electrical connection vias made in the main board 2 (labeled from the outside to the inside by the references 29 and 30).

The front face 31 of the intermediate board 3 carries in its middle and some distance away an integrated circuit chip 32, by way of electrical connection balls 33, and its rear face 34 has pads 35 disposed in accordance with the electrical connection balls of the matrices 6, 11, and 24 and onto which these balls are welded.

The intermediate board 3 also has an array of electrical connection tracks, on its surface and/or integrated, which link the electrical connection balls 33 and the pads 35.

The front face 36 of the main board 2 has pads 37 disposed in accordance with the electrical connection balls of the matrices 6, 11, and 24 and onto which these balls are welded.

FIG. 2 shows a partial top view of the main board of this embodiment. As shown, the front face 36 of the main board 2 has radiating electrical connection tracks 38 which are linked to the electrical connection balls 7 by way of corresponding pads 37, and radiating tracks 39 which pass between these balls 7 and are linked to the electrical connection balls 8 by way of the corresponding pads 37.

In the space 4, the front face 36 of the main board 2 has short electrical connection tracks 40 which link the electrical connection balls 10 and the vias 16, and short electrical connection tracks 41 which pass between these balls and these vias and which link the electrical connection balls 9 and the vias 17.

Likewise, the front face 36 of the main board 2 has short electrical connection tracks 42 and 43 which link the vias 20 and 21 to the central balls 13.

In the space 4, the front face 36 of the main board 2 furthermore has short electrical connection tracks 44 which link the electrical connection balls 26 and the vias 29, and short electrical connection tracks 45 which pass between these balls and these vias and which link the electrical connection balls 25 and the vias 30.

The main board 2 furthermore has an array of electrical connection tracks 46, on its rear face and/or integrated, which are linked to the aforesaid vias.

The array constituted by the tracks 38, the array constituted by the tracks 39, and the array of electrical connection tracks 46 are linked to electrical or electronic components that are carried by the main board and situated outside the surface covered by the intermediate board 3. These components thus are linked to the chip 32 by way of the intermediate board 3.

The balls of the matrices 6, 11, and 24 and the vias of the matrices 14, 18, and 28 are advantageously disposed in this embodiment according to a large matrix 47 with constant pitch.

The present invention is not limited to the embodiment described above. For example, the intermediate rows of balls 25 and 26 and the intermediate rows of vias 29 and 30 could be disposed relative to one another in a different manner, such as by alternating them or by placing the two rows of balls one beside the other and the rows of vias on either side of these rows of balls and vice versa. Similarly, the numbers of rows of balls and/or of vias could also be different.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A device for electrical connection of an integrated circuit chip, the device comprising:

a main board including electrical connection pads and electrical connection tracks on a first face, the main board also including electrical connection vias;

an intermediate board including first electrical connection pads on a first face for connection of the chip, second electrical connection pads on a second face, and electrical connections between the first and second pads; and electrical connection balls located in a space separating the main board and the intermediate board, the electrical connection balls being interposed between the pads of the main board and the second pads of the intermediate board, wherein a peripheral zone of the space comprises a peripheral matrix of four rows of balls on a peripheral side of the space, the rows of the matrix being defined in a longitudinal direction, a central zone of the space comprises a central matrix of balls, a first secondary zone of the space is adjacent to the peripheral zone of the space, the first secondary zone comprising a matrix of two rows of electrical connection vias made in the main board and linked by the connection tracks to respective balls of the two adjacent rows of balls of the peripheral matrix, a second secondary zone of the space comprises a matrix of at least two rows of electrical connection vias made in the main board and linked by the connection tracks to respective balls of the central matrix, the first secondary zone and the second secondary zone are separated by an intermediate zone of the space, and the intermediate zone is divided into at least two parts, one part of the intermediate zone comprising at least one row of electrical connection balls, and another part of the intermediate zone comprising electrical connection vias made in the main board and linked by the connection tracks to respective balls of the one part of the intermediate zone.

2. The device according to claim 1, wherein the intermediate zone comprises at least two rows of electrical connection balls and at least two rows of electrical connection vias made in the main board.

3. The device according to claim 2, wherein the pads and the vias of the main board are, relative to one another, disposed according to a constant pitch in at least the longitudinal direction.

4. The device according to claim 1, wherein the pads and the vias of the main board are, relative to one another, disposed according to a constant pitch in at least the longitudinal direction.

5. The device according to claim 1, wherein the main board is a printed circuit board with a plurality of layers.

6. The device according to claim 1, wherein at least some of the connection tracks on the first face of the main board are substantially defined in a lateral direction.

7. The device according to claim 1, wherein the connection tracks on the first face of the main board are substantially defined in a lateral direction.

8. The device according to claim 1, wherein the pads and the vias of the main board are, relative to one another, disposed according to a constant pitch in both the longitudinal and lateral directions.

9. A device for electrical connection, the device comprising:
   a main board including pads, and vias electrically connected to the pads;
   an intermediate board including first pads on a first face, and second pads on a second face that are electrically connected to the first pads; and
   balls located in a space between the main board and the intermediate board, the balls being interposed between the pads of the main board and the second pads of the intermediate board,
   wherein the balls comprise a peripheral matrix of at least two rows of balls on a peripheral side in a peripheral zone of the space, and a central matrix of balls in a central zone of the space, the rows of the matrix being defined in a longitudinal direction,
   the vias of the main board comprise:
      a first matrix of two rows of vias in a first secondary zone of the space that is adjacent to the peripheral zone of the space, the vias of the first matrix being electrically connected to respective balls of the peripheral matrix; and
      a second matrix of vias in a second secondary zone of the space, the vias of the second matrix being electrically connected to respective balls of the central matrix,
   the first secondary zone and the second secondary zone are separated by an intermediate zone of the space, the intermediate zone being divided into at least first and second parts,
   the balls further comprise at least one row of balls in the first part of the intermediate zone, and
   the vias of the main board further comprise vias in the second part of the intermediate zone that are electrically connected to respective balls in the first part of the intermediate zone.

10. The device according to claim 9,
   wherein the balls further comprise at least two rows of balls in the first part of the intermediate zone, and
   the vias of the main board further comprise at least two rows of vias in the second part of the intermediate zone.

11. The device according to claim 10, wherein the pads and the vias of the main board are disposed according to a constant pitch in at least the longitudinal direction.

12. The device according to claim 9, wherein the pads and the vias of the main board are disposed according to a constant pitch in at least the longitudinal direction.

13. The device according to claim 9, wherein the main board is a printed circuit board with a plurality of layers.

14. The device according to claim 9, further comprising a chip connected to the first electrical connection pads on the first face of intermediate board.

* * * * *